United States Patent
Takenaka et al.

(10) Patent No.: US 6,713,683 B2
(45) Date of Patent: Mar. 30, 2004

(54) WIRING BOARD WITH TERMINALS AND METHOD FOR MANUFACTURING THE SAME

(75) Inventors: Masatoshi Takenaka, Mikata-gun (JP); Shinji Okuma, Obama (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 10/270,180

(22) Filed: Oct. 15, 2002

(65) Prior Publication Data

US 2003/0072142 A1 Apr. 17, 2003

(30) Foreign Application Priority Data

Oct. 15, 2001 (JP) .................................. 2001-316411

(51) Int. Cl.[7] .............................. H05K 7/06; H05K 3/38
(52) U.S. Cl. ...................... 174/259; 174/261; 29/830; 29/831
(58) Field of Search ................. 174/254–259; 361/749–751; 428/213, 214

(56) References Cited

U.S. PATENT DOCUMENTS

| 4,588,456 A | * | 5/1986 | Dery et al. ................... 156/52 |
| 5,526,563 A | * | 6/1996 | Tamaki et al. ................ 29/830 |
| 6,034,331 A | * | 3/2000 | Tsukagoshi et al. ........ 174/250 |
| 6,333,466 B1 | * | 12/2001 | Miyaake et al. ............ 174/254 |
| 6,376,050 B1 | * | 4/2002 | Terasaki et al. ............ 428/209 |

FOREIGN PATENT DOCUMENTS

JP        05-327209        12/1993

* cited by examiner

Primary Examiner—John B. Vigushin
(74) Attorney, Agent, or Firm—Parkhurst & Wendel, L.L.P.

(57) ABSTRACT

In a wiring board having a terminal for connection of circuits in a variety of electronic devices, a joining section of the terminal is placed on a connecting section of a wiring pattern on the top surface of a lower substrate, two layers of adhesives having different softening temperatures are formed between the lower substrate and an upper substrate, and the lower substrate and the upper substrate are cemented sandwiching the joining section. With this structure, a stable holding force can be secured over a wide temperature range.

10 Claims, 3 Drawing Sheets

WIRING BOARD WITH TERMINALS AND METHOD FOR MANUFACTURING THE SAME

TECHNICAL FIELD

The present invention relates to a wiring board with terminals for use in connecting circuits in a variety of electronic devices and a method for such a wiring board.

BACKGROUND ART

In recent years, flexible wiring boards are in wide use in a variety of electronic devices for connection between a plurality of circuit boards on which electronic components have been mounted, or for connecting a circuit board with a motor or circuit components and the like.

Referring to FIGS. 5 and 6, a description will be given on such a conventional wiring board with terminals. For easy understanding of the structure, drawings are shown with the dimension in the direction of the thickness expanded.

FIG. 5 is a partially sectional view of a conventional wiring board with terminals, and FIG. 6 is an exploded perspective view of a conventional wiring board with terminals. In the drawings, a plurality of wiring patterns 22 are formed by etching a thin film of a copper alloy and the like on the top surface of a film-like lower substrate 21 made of polyethylene terephthalate and the like having flexibility. Insulating layer 23 made of a polyester resin and the like covers the entire surface excluding connecting section 22A on both ends of wiring pattern 22. And, on the top surface of one end of connecting section 22A of lower substrate 21, terminal 25 is placed of which joining section 25A on one end is roughly T-shaped and which is made of a thin metal plate. Also, anisotropically-conductive adhesive 27 is coated on the bottom surface of film-like upper substrate 26 made of polyethylene terephthalate and the like. Adhesive 27 is prepared by dispersing in a rubber-based adhesive such as chloroprene rubber electrically conductive powders made by plating nickel or resin with a precious metal. A wiring board having such structure has been formed in the following manner. (1) Joining section 25A of terminal 25 made of a thin metal plate is placed on one end of connecting section 22A of lower substrate 21. (2) Upper substrate 26 is placed on connecting section 22A. (3) By pressing from the top surface of upper substrate 26 with heat, anisotropically-conductive adhesive 27 softens and solidifies thereby cementing lower substrate 21 and upper substrate 26 while sandwiching terminal 25.

A wiring board having above structure is installed in an electronic device. For example, lead wires of a motor and various elements are soldered to the end of terminal 25, and circuit boards are connected to connecting section 22A on the other end by means of a connector and the like. In this way, connection between a motor and the like and circuit boards are accomplished through terminal 25, conductive powder in anisotropically-conductive adhesive 27 and wiring pattern 22.

However, although such wiring board having terminals is superior in adhesion at room temperature, adhesive strength decreases when in use at elevated temperatures due to softening of anisotripically-conductive adhesive 27 thus lowering the holding power of terminal 25. The reason for this is because anisotropically-conductive adhesive 27 that cements terminal 25 comprises relatively low softening-temperature rubber such as chloroprene rubber of which the adhesion decreases at elevated temperatures.

In order to solve this problem, while two or more adhesive materials may be blended, the selection of materials is difficult as blending is difficult depending on the material combination, or materials are limited.

DISCLOSURE OF THE INVENTION

A wiring board with terminals is provided which is constructed by forming between an upper and a lower substrates two layers of adhesives that have different softening temperatures. And a method for manufacturing such a wiring board is provided.

BEST MODE FOR CARRYING OUT THE INVENTION

Referring to FIG. 1 to FIG. 4, a description will be given on exemplary embodiments of the present invention. For ease of understanding of the structure, diagrams are drawn with the dimension in the direction of thickness expanded. Also, those parts that have the same structure are assigned with the same numerals and description is simplified.

First Exemplary Embodiment

Figure 1:
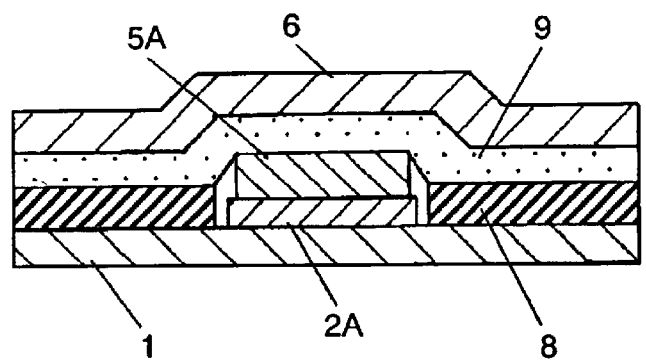
FIG. 1 is a partially sectional view of a wiring board with terminals in a first exemplary embodiment of the present invention.
Figure 2:
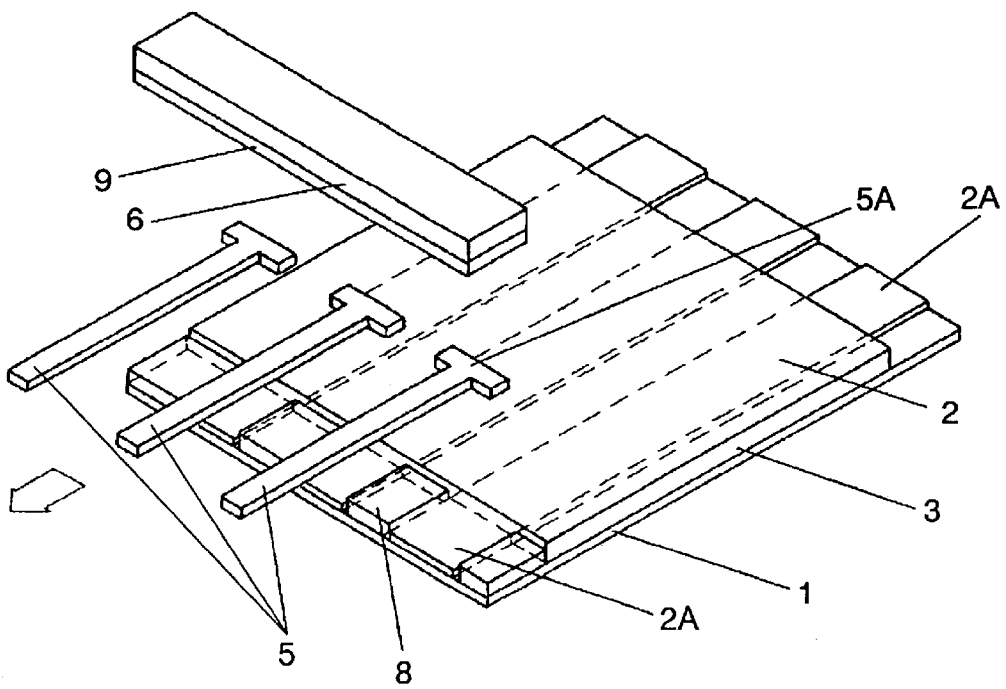
FIG. 2 is an exploded perspective view of a wiring board with terminals in a first exemplary embodiment of the present invention.

FIG. 1 is a partially sectional view of a wiring board with terminals in a first exemplary embodiment of the present invention, and FIG. 2 is an exploded perspective view of a wiring board with terminals in a first exemplary embodiment of the present invention. In the diagrams, on the top surface of lower substrate 1, a plurality of wiring patterns 2 are formed by either etching thin films of a copper alloy and the like or screen printing resins dispersed with carbon or silver. Lower substrate 1 is a film-like flexible substrate made of polyethylene terephthalate or polyimide and the like. Insulating layer 3 consisting of a polyester resin or epoxy resin and the like covers the entire surface excluding connecting section 2A on both ends of wiring patterns 2. A rubber-based adhesive 8 that exhibits superior adhesion at room temperature and consists of at least one of chloroprene rubber, isoprene rubber, and butadiene rubber is coated between a plurality of connecting sections 2A on the top surface of lower substrate 1. Also, on the top surface of one end of connecting section 2A of lower substrate 1, terminal 5 is placed which is made of a thin metal plate such as a copper alloy and one end of which, joining section 5A, is formed roughly in T-letter shape. Furthermore, on the bottom surface of film-like upper substrate 6 made of polyethylene terephthalate and the like, adhesive 9 is coated. Adhesive 9 consists of at least one of a polyester resin, polyethylene resin, and polyurethane resin and consists of a thermoplastic resin-based adhesive that has a softening temperature different from that of adhesive 8 and is low in the reduction of adhesion even at elevated temperatures when compared with rubber-based adhesives. A wiring board having such structure is formed in the following manner. (1) Joining section 5A of terminal 5 made of a thin metal plate is laid on one end of connecting section 2A of lower substrate 1. (2) Upper substrate 6 is placed on joining section 5A. (3) By pressing from the top surface of upper substrate 6 with heat, adhesive 8 and adhesive 9 soften and solidify thereby cementing lower substrate 1 and upper substrate 6 while sandwiching joining section 5A of terminal 5.

Also, a wiring board having a structure as described above is installed in an electronic device. For example, lead wires of a motor and various elements are soldered to the tip on one end of terminal 5. Circuit boards are connected to connecting section 2A on the other end by means of a connector and the like. In this way, connection between a motor and the like and circuit boards are accomplished through terminal 5 and wiring patterns 2.

Such an electronic device and a wiring board installed in it is normally used at room temperature. However, depending on the place of installation of the device, there is a case in which it is used at an elevated temperature. Even on such an occasion, it is necessary to stably connect a motor and the like and a circuit board by means of a wiring board. With the wiring board in accordance with this exemplary embodiment, as terminals 5 are held by two layers of adhesives 8 and 9 that have different softening temperatures, a stable terminal holding force can be obtained over a wide temperature range.

Also, when assembling by pressing the top surface of upper substrate 6 with heat, two layers of adhesives 8 and 9 are filled in the periphery of the right and left protrusions of the roughly T-shaped joining section 5A thus enhancing the strength of the cemented portions to hold the terminals and the strength against pull or push.

In this exemplary embodiment, as the adhesive layer consists of two layers, it enables one to obtain a wiring board with terminals in which a stable terminal holding force is secured over a wide temperature range from room temperature to elevated temperatures. Furthermore, there is less limitation on the selection of materials. Here, one of the adhesives, adhesive 8, is a rubber-based adhesive such as chloroprene rubber, isoprene rubber, or butadiene rubber that is superior in adhesion at room temperature. The other, adhesive 9, is an adhesive having a different softening temperature and based on a thermoplastic resin such as a polyester resin, polyethylene resin, or polyurethane resin having a relatively high softening temperature and with which reduction in adhesion at elevated temperatures is less compared with rubber-based adhesives.

In the structure described above, although adhesive 8 is coated on the top surface of lower substrate 1 and adhesive 9 is coated on the bottom surface of upper substrate 6, the structure may be such that adhesive 9 is coated on lower substrate 1 and adhesive 8 is coated on upper substrate 6.

Second Exemplary Embodiment

Figure 3:
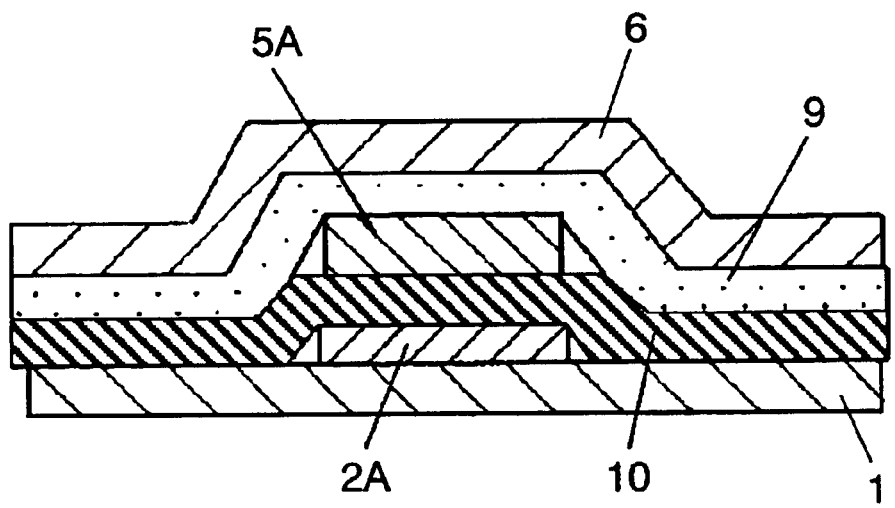
FIG. 3 is a partially sectional view of a wiring board with terminals in a second exemplary embodiment of the present invention.

FIG. 3 is a partially sectional view of a wiring board with terminals in a second exemplary embodiment. As illustrated in FIG. 3, one of the two layers of adhesives is anisotropically-conductive adhesive 10 prepared by dispersing in chloroprene rubber, isoprene rubber, or butadiene rubber, a conductive powder made by plating a precious metal on nickel or resin. The structure is such that adhesive 10 is coated on the entire surface of the ends of the top surface of lower substrate 1. As this allows joining section 6A to be sandwiched between two layers of adhesive 9 and adhesive 10, holding force of terminal 5 can be further enhanced. Also, since joining section 5A and connecting section 2A are connected via conductive powder of anisotropically-conductive adhesive 10, electrical connection between terminal 5 and wiring patterns 2 is stabilized. Here, the structure may be such that joining section 5 and joining section 2A are connected by a composition made by dispersing conductive powder in an adhesive based on a thermoplastic resin such as a polyester resin, polyethylene resin, or polyurethane resin. In such a case, joining section 5 and upper substrate 6 are joined using a rubber-based adhesive.

Third Exemplary Embodiment

Figure 4:
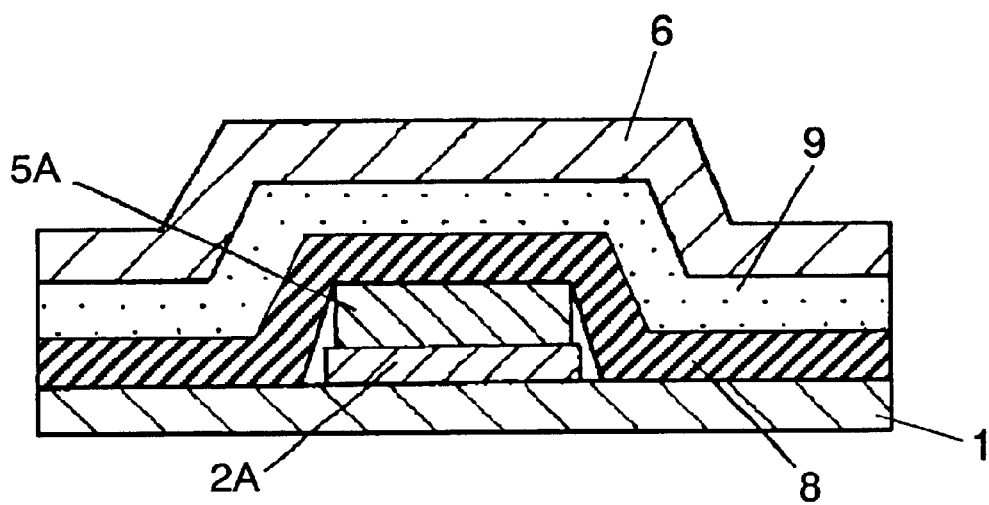
FIG. 4 is a partially sectional view of a wiring board with terminals in a third exemplary embodiment of the present invention.
Figure 5:
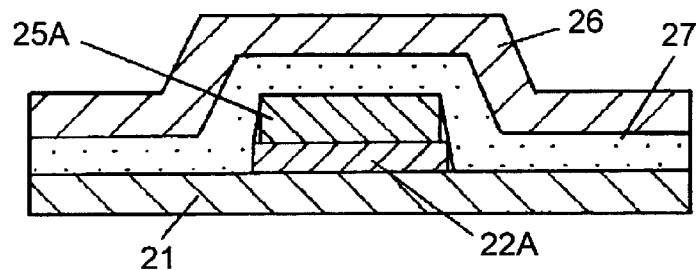
FIG. 5 is a partially sectional view of a conventional wiring board with terminals.
Figure 6:
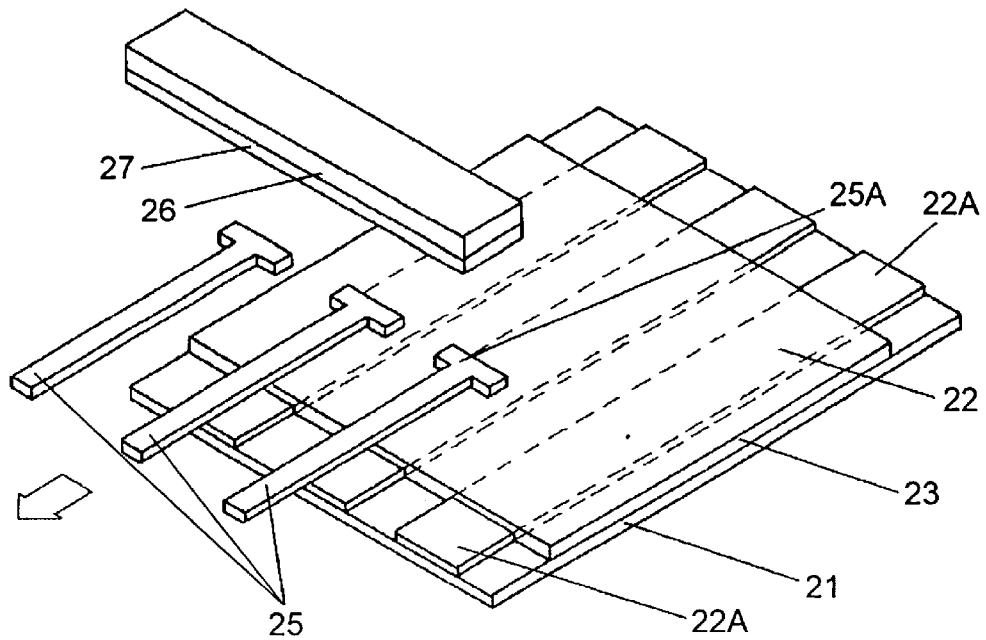
FIG. 6 is an exploded perspective view of a conventional wiring board with terminals.

FIG. 4 is a partially sectional view of a wiring board with terminals in a third exemplary embodiment. As illustrated in FIG. 4, by forming two layers of adhesive 8 and adhesive 9 on top of the other on the bottom surface of upper substrate 6, formation of adhesives can be performed on the side of upper substrate 6 alone thus enabling simpler fabrication.

In the above description, while the structure is such that only a plurality of wiring patterns 2 are formed on the top surface of lower substrate 1, an electroluminescent element may be formed at a predetermined position on lower substrate 1 by laminating a light-transmitting electrode layer, a luminescent layer, and a backplate electrode layer thereby providing light-emitting function.

What is claimed is:

1. A wiring board with a terminal comprising:

a lower substrate having a wiring pattern located on a top surface thereof;

a terminal comprising a metal having a joining section for joining with a connecting section of a wiring pattern of said lower substrate; and an upper substrate cemented with an adhesive to said lower substrate sandwiching said terminal; wherein
said adhesive comprises, after curing, two layers having different softening temperatures and different reductions of adhesive property with increasing temperature.

2. The wiring board with a terminal of claim 1, wherein one of said two layers of adhesive is rubber-based, and the other is thermoplastic resin-based.

3. The wiring board with a terminal of claim 2, wherein said rubber-based adhesive comprises at least one of chloroprene rubber, isoprene rubber, and butadiene rubber.

4. The wiring board with a terminal of claim 2, wherein said thermoplastic resin-based adhesive comprises at least one of polyester resin, polyethylene resin, and polyurethane resin.

5. The wiring board with a terminal of claim 1, wherein at least one of said two layers of adhesive is an anisotropically-conductive adhesive comprising conductive powder dispersed in a synthetic resin.

6. The wiring board with a terminal of claim 5, wherein said terminal is located between said two layers of adhesive, and said anisotropically-conductive adhesive is located between said terminal and a wiring pattern on said lower substrate.

7. The wiring board with a terminal of claim 1, wherein said two layers of adhesive are located on said upper substrate.

8. The wiring board with a terminal of claim 1, wherein the joining section of said terminal is substantially T-shaped.

9. A method of forming a wiring board with a terminal comprising:

placing a joining section of a terminal made of a metal on a connecting section of a wiring pattern formed on a top surface of a lower substrate; and cementing an upper substrate to said lower substrate with an adhesive in a manner sandwiching said terminal, wherein said adhesive comprises two layers, after curing, having different softening temperatures and different reductions of adhesive property with increasing temperature.

10. The method of forming a wiring board with a terminal of claim 9, further comprising forming said two layers of adhesive on said upper substrate.

* * * * *